(12) United States Patent
Tursi et al.

(10) Patent No.: US 6,417,705 B1
(45) Date of Patent: Jul. 9, 2002

(54) OUTPUT DRIVER WITH DLL CONTROL OF OUTPUT DRIVER STRENGTH

(75) Inventors: Maria R. Tursi; Robert C. Taft, both of Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/640,808

(22) Filed: Aug. 16, 2000

Related U.S. Application Data

(60) Provisional application No. 60/198,119, filed on Apr. 18, 2000.

(51) Int. Cl.$^7$ ................................................. H03L 7/06
(52) U.S. Cl. ....................... 327/158; 327/109; 327/151; 327/160; 375/372; 326/82
(58) Field of Search ................................. 327/144, 146, 327/150, 153, 155, 161, 108, 112; 331/DIG. 2, 1 A; 375/379, 376, 362; 326/82, 87; 365/233, 233.5, 189.07; 307/412

(56) References Cited

U.S. PATENT DOCUMENTS

| | | | |
|---|---|---|---|
| 6,047,346 A | 4/2000 | Lau et al. | 710/126 |
| 6,087,868 A | 7/2000 | Millar | 327/156 |
| 6,194,916 B1 * | 2/2001 | Nishimura et al. | 327/12 |
| 6,236,695 B1 * | 5/2001 | Taylor | 375/372 |

OTHER PUBLICATIONS

Gabara, Thaddeus J. et al., "Forming Damped LRC Parasitic Circuits in Simultaneously Switched CMOS Output Buffers," *IEEE J. of Solid–State Circuits*, 32:3, pp. 407–417, Mar. 1997.

Choy, C.S. et al., "A Low Power–Noise Output Driver with an Adaptive Characteristic Applicable to a Wide Range of Loading Conditions," *IEEE J. of Solid–State Circuits*, 32:6, pp. 913–917, Jun. 1997.

Kim, B.–S. et al., "100 MHz all–digital delay–locked loop for low power application," *Electronics Letters* 34:18, pp. 1739–1740, Sep. 1998.

Singh, G.P. et al., "A 1.9V I/O Buffer with Gate Oxide Protection and Dynamic Bus Termination for 400MHz UltraSparc Microprocessor," *Digest of Technical Papers*, 1999 IEEE International Solid–State Circuits Conference, 4 pages, Feb., 1999.

Sanchez, H. et al., "a Versatile 3.3V/1.5V/1.8V CMOS I/O Driver Built in a 0.2$\mu$m 3.5nm Tox 1.8V CMOS Technology," *Digest of Technical Papers*, 1999 IEEE International Solid–State Circuits Conference, 5 pages, Feb., 1999.

* cited by examiner

*Primary Examiner*—Timothy P. Callahan
*Assistant Examiner*—Minh Nguyen
(74) *Attorney, Agent, or Firm*—Brett A. Hertzberg

(57) ABSTRACT

An output driver includes an adjustable main output stage and a control circuit with a digital delay locked loop (digital DLL) circuit and an adjustable scaled output stage. The main output stage and the scaled output stage are both configured to adjust their strengths in response to a control signal generated by the control circuit. The control circuit receives a clock signal and propagates a transition through the scaled output stage. The DLL circuit compares the propagation time through the scaled output stage with a reference signal (that is dependent on the clock signal frequency) and generates the control signal as a function of comparison. The main output stage, receiving the same control signal, adjusts its strength in a corresponding manner.

12 Claims, 11 Drawing Sheets

OUTPUT DRIVER WITH DLL CONTROL OF OUTPUT DRIVER STRENGTH

CROSS-REFERENCE TO RELATED APPLICATIONS

This application claims the benefit under 35 U.S.C. §119 (e) of U.S. Provisional Application No. 60/198,119, filed Apr. 18, 2000.

FIELD OF THE INVENTION

The present invention relates to integrated circuits and, more particularly, to output drivers for use in integrated circuits.

BACKGROUND INFORMATION

Output drivers are typically used to drive a signal onto a bus line that has a relatively large load. For many applications, the strength of the output driver (which is related to the effective width-to-length ratio of the pull-up and pull-down devices implementing the output driver) is carefully designed to quickly drive the signal under the expected load conditions but at the same time, not too quickly so as to cause noise problems on the power buses. In an integrated circuit, several factors can affect the strength of an output driver. For example, variations in process, supply voltage and temperature (i.e., PVT) can affect the strength of the output driver, thereby creating timing and/or noise problems. In addition, the strength requirements of the output drivers of a digital or mixed signal integrated circuit may change depending on the clock frequency. For example, a circuit may use a reduced clock frequency in a power-saving mode (which tends to reduce dynamic power dissipation in the circuit). Because the lower clock frequency generally relaxes the rise and fall time requirements of the output driver, the output driver strength can be also be reduced (which also tends to reduce dynamic power dissipation) without causing additional timing problems.

Conventional output drivers may use relatively complex analog techniques and/or external elements to adjust the output driver strength. In addition, the area occupied by circuits implementing such conventional techniques tends to be relatively large. Accordingly, there is a need for an output driver that can automatically adjust its strength in response to PVT and clock frequency variations.

SUMMARY

In accordance with aspects of the present invention, an output driver that can adjust its strength in response to PVT and clock frequency variations is provided. In one aspect of the present invention, the output driver includes an adjustable main output stage and a control circuit with a digital delay locked loop (digital DLL) circuit and an adjustable scaled output stage. The main output stage and the scaled output stage are both configured to adjust their strengths in response to a control signal generated by the control circuit. The control circuit receives a clock signal and propagates a transition (e.g., a rising edge or a falling edge) through the scaled output stage. The time required to propagate the transition through the scaled output stage is dependent on the strength of the scaled output stage. The DLL circuit compares the propagation time through the scaled output stage with a reference signal (that is dependent on the clock signal frequency) and generates the control signal as a function of comparison. In particular, the DLL circuit generates the control signal to adjust the scaled output stage strength (instead of a delay line as in a conventional DLL) so as to synchronize the propagation time with the reference signal. The main output stage, receiving the same control signal, adjusts its strength in a corresponding manner. In a further refinement, the DLL is a digital DLL.

When PVT and/or clock signal variations occur, the synchronization between the propagation time and the reference signal will be perturbed, which causes the DLL circuit to generate the control signal so as to readjust the strength of the scaled output stage so that the propagation time is again synchronized with the reference signal. The use of the DLL circuit in the control circuit allows the output driver to be less complex and smaller than conventional output drivers that use analog techniques to compensate for variations in PVT.

In accordance with another aspect of the present invention, the DLL circuit includes an up/down counter and a filter circuit to generate a digital control signal to adjust the strengths of the main and scaled output stages. For example, in one embodiment, the counter is a three-bit counter generating a three-bit digital control signal. In a further refinement, the control signal enables/disables a number of parallel pull-up/pull-down blocks (also referred to herein as "fingers") that form each output stage in response to the count of the counter. For example, in one embodiment the most significant bit of the three-bit control signal enables/disables a set of four fingers, the next most significant bit enables/disables a set of two fingers, while the least significant bit enables/disables one finger. In yet a further refinement, one or more additional fingers are configured to be enabled outside whenever the output driver is activated. Thus, when the counter counts zero, the output driver will have some predetermined minimum number of enabled fingers.

DETAILED DESCRIPTION

Figure 1:
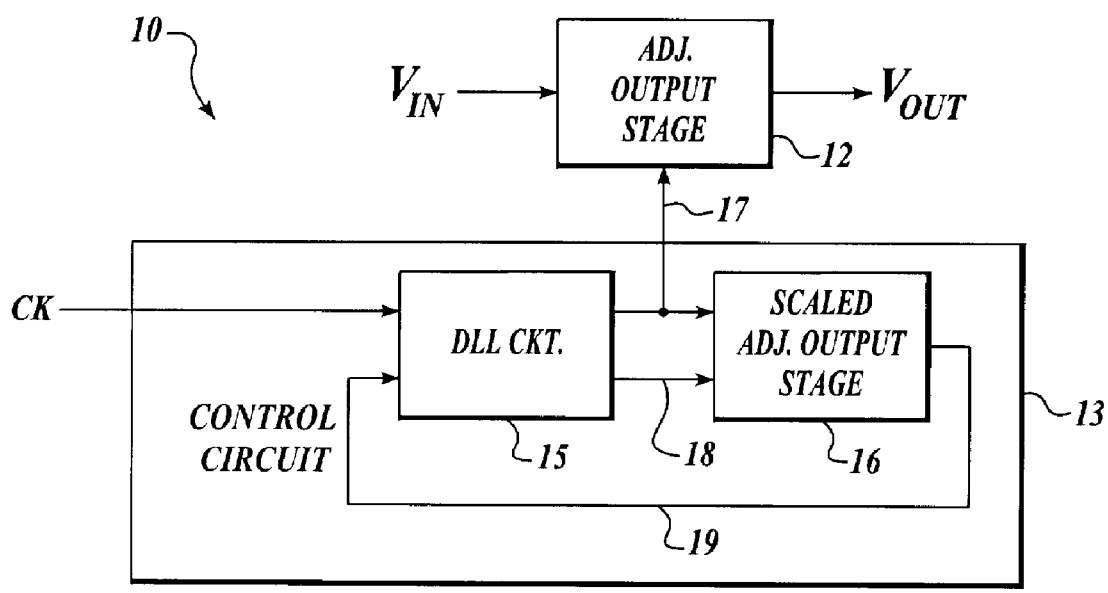
FIG. 1 is a block diagram illustrating an output driver, according to one embodiment of the present invention.

FIG. 1 illustrates an output driver 10, according to one embodiment of the present invention. Output driver 10 includes and adjustable output stage 12 and a control circuit 13. Adjustable output stage 12 is also referred to herein as the main output stage. Control circuit 13 includes a DLL circuit 15 and a scaled adjustable output stage 16 (also referred to herein as the scaled output stage). Scaled output stage 16 is essentially identical to main output stage 12, except smaller by a predetermined ratio. In one embodiment, scaled output stage 16 is scaled to one-fifth the size of main output stage 12. In addition, scaled output stage 16 includes a load, which is designed to be a scaled (at the same proportion as the scaled output stage 16) of the expected maximum load to be driven by main output stage 12. This design helps ensure that scaled output stage 16 will have the same timing characteristics as main output stage 12 in driving the maximum expected load. That is, scaled output stage 16 is used to model the timing characteristics of main output stage 12. Control circuit 13 adjusts the strength of main and scaled output stages 12 and 16, as described further below.

This embodiment of output driver 10 is interconnected as follows. Main output stage 12 is connected to receive an input signal $V_{IN}$ and generate an output signal $V_{OUT}$ as a function of input signal $V_{IN}$. Typically, output signal $V_{OUT}$ is generated to have either the same (or complemented in some applications) logic value as input signal $V_{IN}$. Main output stage 12 receives a control signal from control circuit 13 through a line 17. Control circuit 13 is connected to receive a clock signal CK, which is provided to DLL circuit 15. DLL circuit 15 generates a control signal for controlling the strength of main and scaled output stages 12 and 16 at line 17. Scaled output stage 16 also receives an internal input signal from DLL circuit 15 through a line 18. This internal input signal is generated from 16, which is then fed back to DLL circuit 15 through a line 19.

Output driver 10 operates as follows. Control circuit 13 receives clock signal CK and propagates the clock signal to DLL circuit 15. DLL circuit 15 generates the internal input signal from the clock signal CK, which is then provided to scaled output stage 16 through line 18. Scaled output stage 16 propagates the internal input signal and feeds it back to DLL circuit 15 so that the propagation time through scaled output stage 16 can be monitored. This propagation time is dependent on the strength of scaled output stage 16. DLL circuit 15 compares the propagation time through scaled output stage 16 with a reference signal. The reference signal is generated so as to define the desired propagation time through scaled output stage 16. This desired propagation time is predetermined so as to meet the timing requirements of the overall circuit.

DLL circuit 15 compares the propagation time with the reference signal and generates the control signal as a function of this comparison. In effect, DLL circuit 15 generates the control signal using negative feedback techniques to adjust the strength of scaled output stage 16 (instead of a delay line as in a conventional DLL) so as to synchronize the propagation time with the reference signal. Main output stage 12, receiving the same control signal, adjusts its strength in a corresponding manner. Because scaled output stage 16 models the timing characteristics of main output stage 12 under maximum load conditions, the control signal will cause main output stage 12 to have the minimum strength necessary to meet the desired timing requirements of the overall circuit.

If PVT and/or clock signal variations occur, the synchronization between the propagation time and the reference signal will be perturbed. In response to this perturbation, DLL circuit 15 generates the control signal so as to readjust the strength of scaled output stage 16 so that the propagation time is again synchronized with the reference signal. The use of DLL circuit 15 in control circuit 13 allows output driver 10 to be less complex and smaller than conventional output drivers that use analog techniques to compensate for variations in PVT. In addition, output driver 10 is suitable for use in mixed-signal integrated circuits (which tend to be more sensitive to noise problems than purely digital circuits) because it adjusts its strength to the level needed to meet timing requirements, thereby keeping noise injection to a minimum. In contrast, conventional output drivers may use "over strong" output drivers to ensure that timing requirements are met under worst case conditions, thereby causing large changes in output current that tend to increase noise injection.

Figure 2:
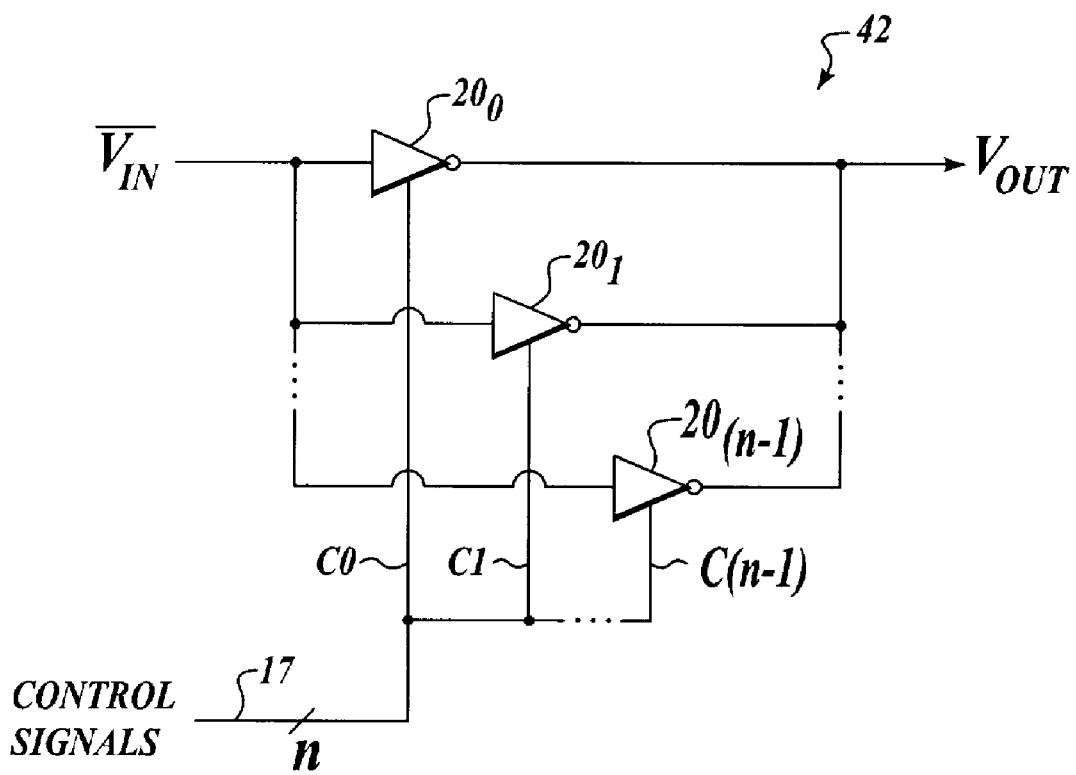
FIG. 2 is a schematic diagram illustrating an adjustable output stage for use in the output driver depicted in FIG. 1, according to one embodiment of the present invention.

FIG. 2 illustrates a portion of main output stage 12 (FIG. 1), according to one embodiment of the present invention. The portion shown in FIG. 2 is one possible implementation of the strength-adjusting portion of main output stage 12. Main output stage 12 basically includes a large number of pull-up transistors connected in parallel and a large number of pull-down transistors connected in parallel. These pull-up and pull-down devices operate to pull up or pull down the voltage at the output lead in response to the input signal to generate output signal $V_{OUT}$. Further, additional transistors are connected to the gate of the pull-up and pull-down devices that serve to enable or disable the output stage. In FIG. 2, each set of pull-up and pull-down transistors are modeled as inverters $20_0$–$20_{n-1}$ that are connected in parallel, receiving in inverted input signal $V_{IN}$ and outputting output signal $V_{OUT}$. In addition, inverters $20_0$–$20_{n-1}$ have a control terminal that allows each inverter to be turned enabled or disabled. In this embodiment, inverters $20_0$–$20_{n-1}$ receive control signals C0–C(n–1), respectively, from control circuit 13 through line 17. Each inverter that is enabled increases the strength of main output stage 12.

In view of this disclosure, those skilled in the art will appreciate that the circuit of FIG. 2 also illustrates an implementation of scaled output driver 16 (FIG. 1), with the transistors implementing the inverters being smaller than those used in main output driver 12 by a predetermined ratio. In one embodiment, the pull-up and pull-down transistors used in main output driver 12 are five times as large as those used in scaled output driver 16.

Figure 3:
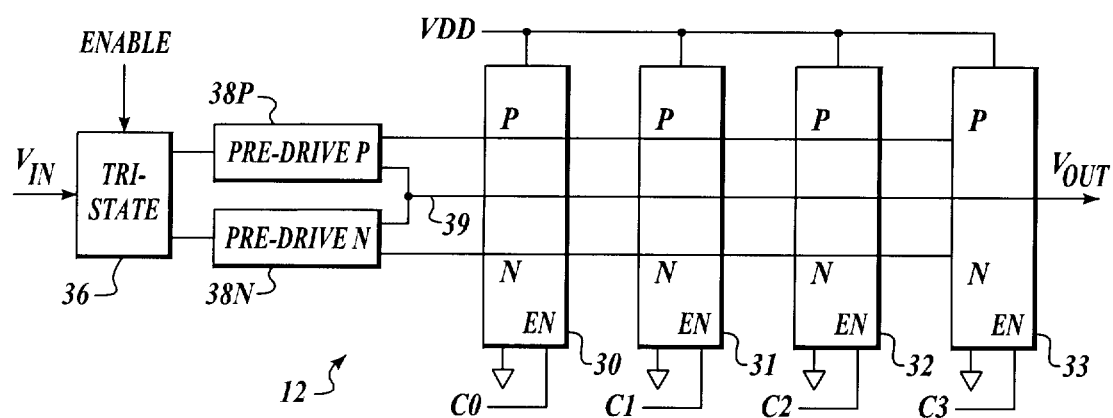
FIG. 3 is a block diagram illustrating a main output stage for use in the output driver depicted in FIG. 1, according to another embodiment of the present invention.

FIG. 3 illustrates main output stage 12 for use in main output driver 12 (FIG. 1), according to another embodiment of the present invention. In this embodiment, output driver 12 includes four output stage cells 30–33, a tri-state circuit 36, and pre-drive circuits 38P and 38N. This embodiment is similar to that illustrated in FIG. 2, except that this embodiment includes tri-state circuit 36 that allows output stage 12 to be configured into a high-impedance state using a single control signal ENABLE, and further includes pre-drive circuits 38P and 38N to adjust the slew rate to compensate for changes in load capacitance. In this embodiment, pre-drive circuits 38P and 38N are inverting slew-limiting pre-drivers that reduce slew rate as the capacitive load decreases. Embodiments of pre-drive circuits 38P and 38N and tri-state circuit 36 are described in more detail below in conjunction with FIG. 4.

In this embodiment, output stage cells 30–33 provide the function of the inverters of FIG. 2. In particular, each of output stage cells 30–33 have pull-up and pull-down transistors (not shown) that when turned on, respectively pull up or pull down the voltage at $V_{OUT}$ line 39, as in a CMOS inverter. More specifically, in each of output stage cells 30–33, the pull-up transistor receives a signal P at its gate while the pull-down transistor receives a signal N. Signal P and signal N are generated by pre-drive circuits 38P and 38N, respectively, in response to the logic level of the input signal $V_{IN}$ and serve to turn the pull-up and pull-down transistors on and off. In this embodiment, signals P and N are essentially identical, except for having different slew rates that are adjusted to compensate for capacitive load variations by the pre-drive circuits. Output stage cells 30–32 also have enable terminals connected to receive control signals C0–C2 from control circuit 13 (FIG. 1) which are used to enable or disable output stage cells 30–32. The enable terminal of output stage cell 33 is connected to the VDD bus so that output stage cell 33 is enabled when output driver 10 (FIG. 1) is powered.

In this embodiment, the sizes (i.e., width-to-length ratios) of the devices in each of output stage cells 30–32 correspond to a binary weighting. That is, output stage cells 30–32 have relative sizes of 1×, 2× and 4×, respectively. In this embodiment, output stage cell 33 has a relative size of 3×. Therefore, in this embodiment, the size of main output stage 12 can be adjusted to range from three to ten cells. Those skilled in the art will appreciate that in other embodiments, the number, size, relative sizes and other parameters of output stage cells can be varied to achieve a desired strength range and adjustment granularity. An output stage cell is described in more detail in conjunction with FIG. 3A.

Figure 3A:
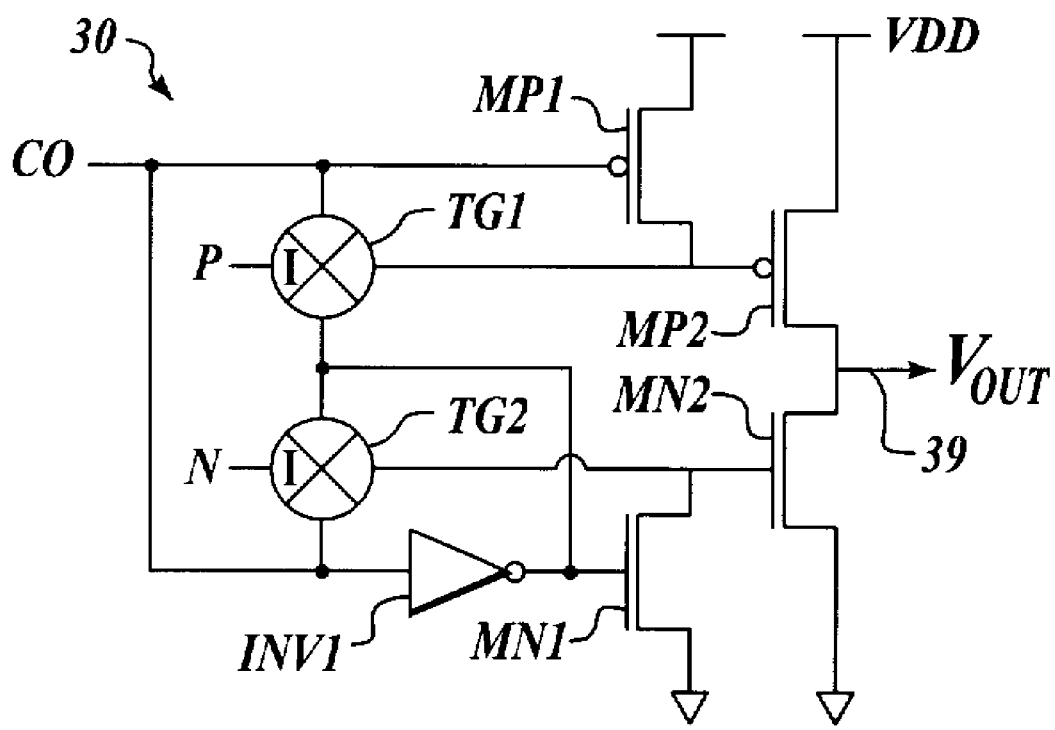
FIG. 3A is a schematic diagram illustrating an output stage cell for use in the main output stage depicted in FIG. 3, according to one embodiment of the present invention.

FIG. 3A illustrates output stage cell 30 (FIG. 3), according to one embodiment of the present invention. In this embodiment, output stage cell 30 includes transmission gates TG1 and TG2, P-channel transistors MP1 and MP2, N-channel transistors MN1 and MN2 and an inverter INV1.

Output stage cell 30 is interconnected as follows. Inverter INV1, the gate of transistor MP1, and the N-channel control terminals of transmission gates TG1 and TG2 are connected to receive control signal C0. Inverter INV1 provides the complement of control signal C0 for operating transmission gates TG1 and TG2 in the standard manner. The output terminal of inverter INV1 is connected to the gate of transistor MN1 and to the P-channel control terminals of transmission gates TG1 and TG2. In addition, transmission gates TG1 and TG2 are respectively connected to receive signals P and N at their input terminals. The output terminals of transmission gates TG1 and TG2 are respectively connected to the drains of transistors MP1 and MN1 and to the gates of transistors MP2 and MN2. The sources of transistors MP1 and MP2 are connected to the VDD bus, and the sources of transistors MN1 and MN2 are connected to the ground bus.

Output cell 30 operates as follows. When control signal C0 is at a logic low level, transmission gates TG1 and TG2 are turned off, while transistors MP1 and MN1 are turned on. This turns off transistors MP2 and MN2 by pulling up the voltage at the gate of transistor MP2 and pulling down the voltage at the gate of transistor MN2. Consequently, output stage cell 30 presents a high impedance at VOUT line 39.

When control signal C0 is at a logic high level, transmission gates TG1 and TG2 are turned on, and transistors MP1 and MN1 are turned off. This configuration allows transmission gates TG1 and TG2 to pass signals P and N to the gates of transistors MP2 and MN2. As described above, signals P and N have the same logic level in steady state when the pre-drive circuits (FIG. 3) are enabled. Consequently, transistors MP2 and MN2 operate as a CMOS inverter, driving signal $V_{OUT}$ at line 39 to a logic level that is the inverse of that of signals P and N.

As will be appreciated by those skilled in the art, output stage cells 31–33 can be implemented in essentially the same manner as output stage cell 30 as shown in FIG. 3A. For example, the width-to-length ratios of transistors MP2 and MN2 may be different (e.g., larger) in output stage cells 31–33. Because output stage cell 33 is always enabled when the circuit is powered, in an alternative embodiment output cell 33 may omit the transmission gates and transistors MP1 and MN1 by receiving signals P and N directly at the gates of transistors MP2 and MN2. In addition, the output stage cells of scaled output driver 16 (FIG. 1) may also be implemented as shown in FIG. 3A, with transistors MP2 and MN2 being scaled-down.

Figure 4:
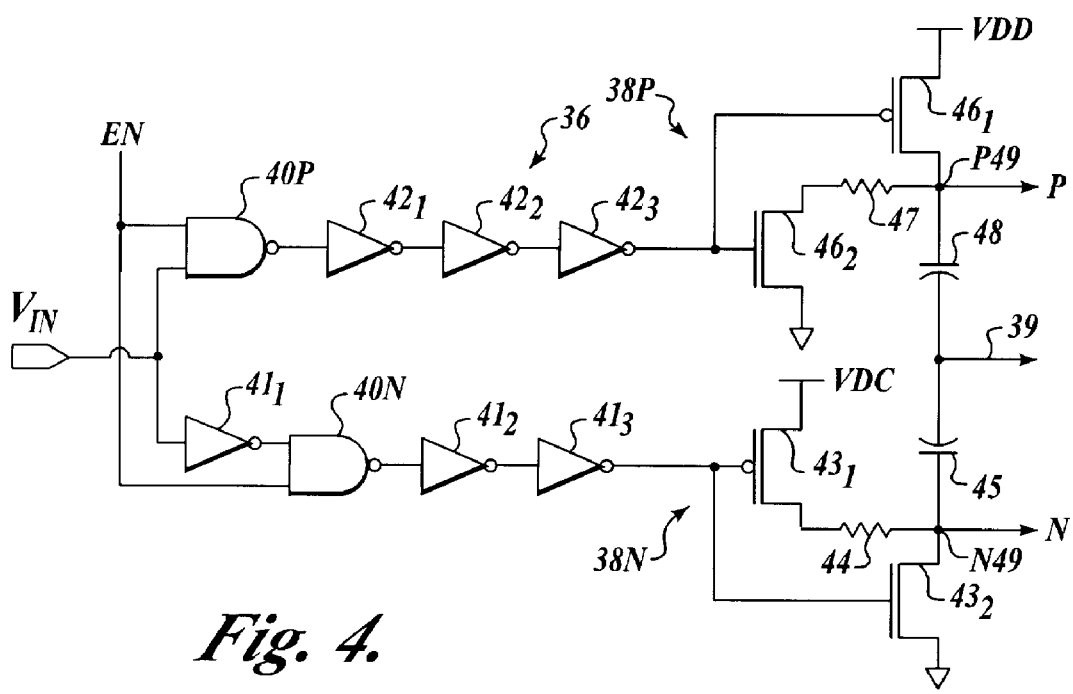
FIG. 4 is a schematic diagram illustrating a pre-drive stage for use in the main output stage depicted in FIG. 3, according to one embodiment of the present invention.

FIG. 4 illustrates tri-state circuit 36 and pre-drive circuits 38P and 38N (FIG. 3), according to one embodiment of the present invention. In this embodiment, tri-state driver 36 includes two-input NAND gates 40P and 40N, and inverters $41_1$–$41_3$ and $42_1$–$42_3$. Pre-drive circuit 38N includes P-channel transistor $43_1$, N-channel transistor $43_2$, resistor 44 and capacitor 45. Pre-drive circuit 38P includes P-channel transistor $46_1$, N-channel transistor $46_2$, resistor 47 and capacitor 48.

In this embodiment, tri-state circuit 36 is interconnected as follows. Inverter $41_1$, and one input lead of NAND gate 40P are connected to receive input signal $V_{IN}$. The output lead of inverter $41_1$, is connected to an input lead of NAND gate 40N. The other input leads of NAND gates 40P and 40N are connected to receive control signal ENABLE. The output lead of NAND gate 40N is connected to cascaded inverters $41_2$–$41_3$ while the output lead of NAND gate 40P is connected to cascaded inverters $42_1$–$42_3$.

Pre-drive circuit 38N is interconnected as follows. The gates of transistors $43_1$ and $43_2$ are connected to the output lead of inverter $41_3$ of tri-state circuit 36. P-channel transistor $43_1$ has its source connected to the VDD bus and its drain connected to a node N49 through resistor 44. N-channel transistor $43_2$ has its source connected to the ground bus and its drain connected to node N49. Capacitor 45 is connected between node N49 and $V_{OUT}$ line 39.

Pre-drive circuit 38P is interconnected as follows. The gates of transistors $46_1$ and $46_2$ are connected to the output lead of inverter $42_3$ of tri-state circuit 36. P-channel transistor $46_1$ has its source connected to the VDD bus and its drain connected to a node P49. N-channel transistor $46_2$ has its source connected to the ground bus and its drain connected to node P49 through resistor 47. Capacitor 48 is connected between node P49 and $V_{OUT}$ line 39.

Tri-state circuit 36 and pre-drive circuits 38P and 38N operate as follows. When control signal ENABLE is at a logic low level, NAND gates 40P and 40N output logic high signals that are propagated through cascaded inverters $42_1$–$42_3$ and cascaded inverters $41_2$–$41_3$, respectively. Thus, cascaded inverters $42_1$–$42_3$ output a logic low signal while cascaded inverters $41_2$–$41_3$ output a logic high signal.

Pre-driver circuit 38P receives the logic low signal from inverter $42_3$, thereby turning on P-channel transistor $46_1$ and turning off N-channel transistor $46_2$. Consequently, pre-drive circuit 38P causes signal P to have a logic high level, which then turns off the pull-up transistors of output stage cells 30–33 (FIG. 3).

Pre-driver circuit 38N receives the logic high signal from inverter $41_3$, thereby turning on N-channel transistor $43_2$ and turning off P-channel transistor $43_1$. This causes pre-drive circuit 38N to output signal N with a logic low level, which then turns off the pull-down transistors of output stage cells 30–33 (FIG. 3). Because both the pull-up and pull-down transistors are turned off, the output driver is configured into a high-impedance state.

When control signal ENABLE is at a logic high level, NAND gates 40P and 40N operate as inverters. Therefore, the logic level of input signal $V_{IN}$ is propagated to pre-drive circuits 38P and 38N with four inversions so that, in effect, pre-drive circuits 38P and 38N receive a slightly delayed version of input signal $V_{IN}$. Pre-drive circuits 38P and 38N then drive signals P and N as the inverse of input signal $V_{IN}$. Capacitors 45 and 48 serve as Miller capacitors, which in conjunction with resistors 44 and 47, allow pre-driver circuits 38P and 38N to implement a inverting slew-limiting pre-driver. Thus, as the capacitive load seen at $V_{OUT}$ line 39 decreases, the Miller compensation decreases the slew-rate.

Figure 5:
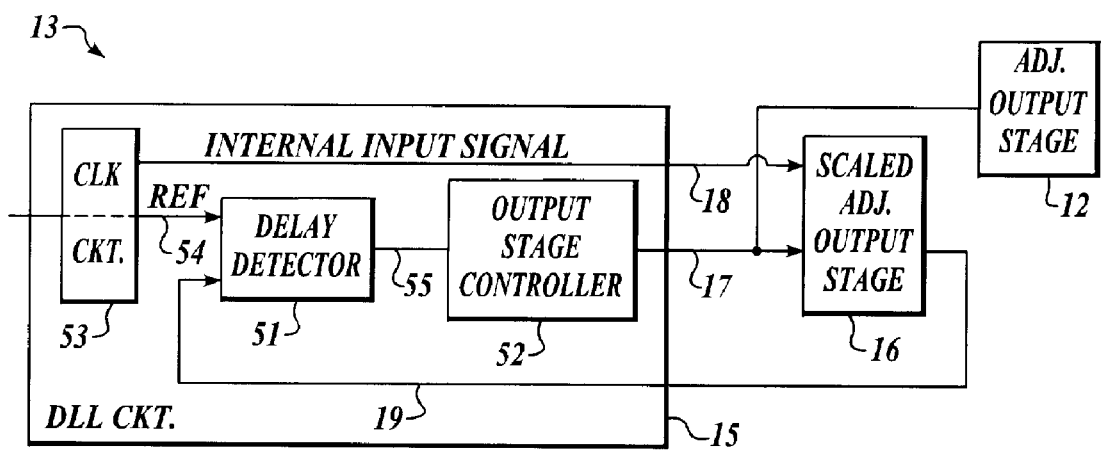
FIG. 5 is a block diagram illustrating a control circuit for use in the output driver depicted in FIG. 1, according to one embodiment of the present invention.

FIG. 5 illustrates control circuit 13 (FIG. 1), according to one embodiment of the present invention. In this embodiment, DLL circuit 15 of control circuit 13 includes a delay detector 51, an output stage controller 52, and a clock circuit 53. Delay detector 51 monitors the signals received at its two input terminals and outputs a comparison signal corresponding to the delay between the two signals. Output stage controller 52 generates the control signal for controlling the strength of main and scaled output stages 12 and 16. Clock circuit 53 provides an internal input signal as a function of the clock signal CK. In one embodiment, the internal input signal is generated by dividing down the frequency of clock signal CK to reduce power dissipation and provide time for the internal input signal to propagate through scaled output stage 16 before the next delay detection cycle begins. In addition, the clock circuit 53 generates a reference signal that defines the desired propagation delay through scaled output stage 16. In view of the present disclosure, those skilled in the art can generate other internal input and reference signals from clock signal CK, or even pass clock signal CK directly to delay detector 51.

This embodiment of control circuit 13 is interconnected as follows. Clock circuit 53 is connected to receive clock signal CK. Clock circuit 53 is connected to provide the internal input signal to scaled output stage 16 through line 18. In addition, clock circuit 53 is connected to provide the reference signal to delay detector 51 through a line 54. Delay detector 51 is connected to provide the comparison signal to output stage controller 52 through a line 55. Output stage controller 52 outputs the control signal to scaled output stage 16 and main output stage 12 through line 17. The internal input signal propagated through scaled output stage 16 is fed back to delay detector 51 through line 19.

Control circuit 13 operates as follows. Clock circuit 53 receives clock signal CK and generates the internal input signal and the reference signal. The internal input signal is then propagated through scaled output stage 16. Clock circuit 53 generates the reference signal to define the desired propagation time of the internal input signal through scaled output stage 16. In one embodiment, the reference signal has a pulse width corresponding to the summation of the rise and fall times desired of scaled output stage 16. In another embodiment, the reference signal has a pulse width corresponding to the desired propagation delay of a single transition. In view of the present disclosure, those skilled in the art can implement other embodiments with different reference signals to define a desired propagation delay.

Delay detector 51 receives the reference signal and the internal input signal after being propagated through scaled output stage 16. Delay detector 51 compares the reference signal to the propagated internal input signal and generates a comparison signal that is a function of the comparison. For example, in one embodiment, at the start of the cycle, delay detector 51 receives a leading edge of the reference signal, while the internal input signal is propagated through scaled output stage 16. If delay detector 51 receives the propagated internal input signal before the trailing edge of the reference signal, then the propagation delay through scaled output stage 16 is relatively small, thereby indicating that the strength of scaled output stage 16 is too great. Delay detector 51 then generates the comparison signal to indicate that the strength of main and scaled output stages 12 and 16 should be reduced.

Conversely, if delay detector 51 receives the propagated internal input signal after the trailing edge of the reference signal, then the propagation delay through scaled output stage 16 is too great, thereby indicating that the strength of scaled output stage 16 is too small. Delay detector 51 then generates the comparison signal to indicate that the strength of main and scaled output stages 12 and 16 should be increased.

Figure 6:
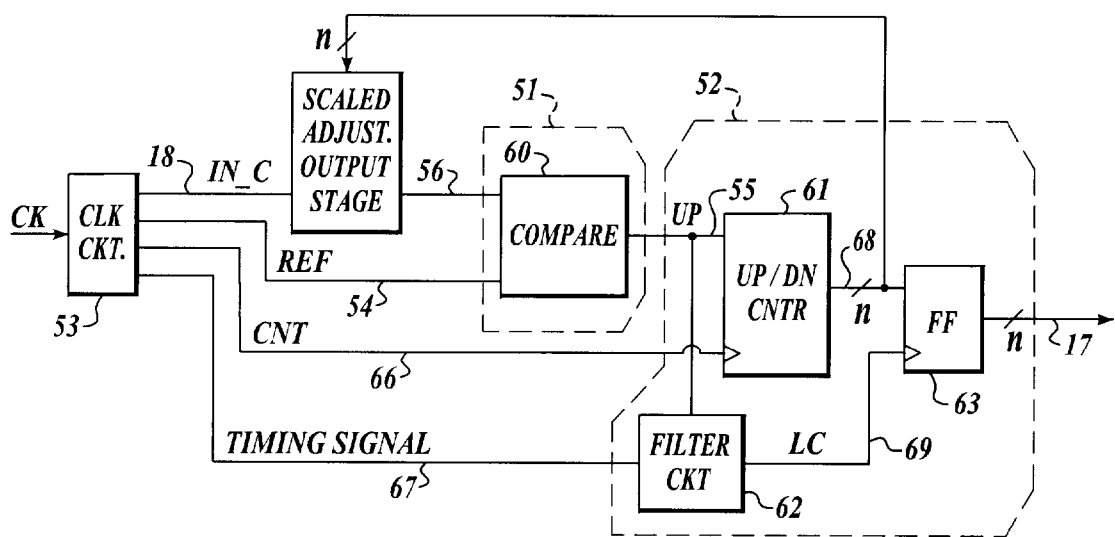
FIG. 6 is a more detailed block diagram illustrating the control circuit depicted in FIG. 5.

FIG. 6 illustrates control circuit 13 (FIG. 5), according to one embodiment of the present invention. FIG. 6 is basically the same as the embodiment of FIG. 5, except that FIG. 6 shows a more detailed implementation of the delay detector 51, output stage controller 52, and clock circuit 53. In this embodiment, delay detector 51 includes a compare circuit 60, and output stage controller 52 includes an up/down counter 61, a filter circuit 62 and flip-flop 63 (in view of the present disclosure, those skilled in the art will appreciate that there are n flip-flops, matching the number of bits in the count generated by up/down counter 61). In this embodiment, compare circuit 60 is a combinatorial logic circuit that generates a digital signal indicating whether the propagation delay is greater than or less than a reference value defined by the reference signal REF. When clocked, up/down counter 61 increments and decrements its count when its input signal is at a logic high level and logic low level, respectively. Further, up/down counter 61 will not wrap-around when its count reaches its minimum and maximum values. Filter circuit 62 is a circuit designed to prevent the count from fluctuating back and forth between two or three values in steady state. Flip-flop 63 is a standard D flip-flop in this embodiment. In the embodiment of FIG. 6, clock circuit 53 generates additional timing signals. More specifically, clock circuit 53 generates internal input signal IN_C and reference signal REF as described above in conjunction with FIG. 5. In addition, clock circuit 53 generates a count signal CNT at a line 66 and a timing signal at a line 67.

Compare circuit 60, up/down circuit 61, filter circuit 62 and flip-flop 63 are interconnected as follows. Compare circuit 60 of delay detector 51 is connected to lines 19 and 54 to respectively receive the internal input signal IN_C propagated through scaled output stage 16 and the reference signal REF from clock circuit 53. Compare circuit 60 generates a comparison signal UP at line 55, which is connected to the input terminal of up/down counter 61 and the input terminal of filter circuit 62. The clock terminal of up/down counter 61 is connected to line 66 to receive count signal CNT. The output terminal of up/down counter 61 is connected to the data terminal of flip-flop 63 through a line 68. This count serves as the control signal provided to scaled output stage 16. Flip-flop 63 also receives the count from up/down counter 61, and stores the current count outputted by up/down counter 61 at the time flip-flop 63 is clocked.

The output lead of filter circuit 62 is connected to the clock terminal of flip-flop 63 through a line 69. The output terminal of flip-flop 63 is connected to line 17, which provides the control signal to main output stage 12.

This embodiment of control circuit 13 operates as follows. As in the embodiment of FIG. 5, clock circuit 53 receives clock signal CK and generates the internal input signal IN_C on line 18 and the reference signal REF on line 54. The internal input signal IN_C is then propagated through scaled output stage 16 and to compare circuit 60 through line 19.

Compare circuit 60 compares reference signal REF to the propagated internal input signal IN_C and generates signal UP as a function of the comparison. In this embodiment, the reference value for the desired propagation time is defined as the pulse width of the reference signal REF (i.e., the time between the rising and falling edges of the reference signal). Thus, compare circuit 60 detects whether a selected transition of signal IN_C is completely propagated through scaled output stage 16 during the pulse of the reference signal. If the transition is propagated through the scaled output stage 16 while the pulse is being received at compare circuit 60, then the propagation delay through scaled output stage 16 is too small. This condition indicates that the strength of scaled output stage 16 is too great. Compare circuit 60 then generates signal UP with a logic low level. This logic low level causes up/down counter 61 to decrement its count. The reduced count then causes scaled output stage 16 to become weaker as described above in conjunction with FIG. 3. When not in steady state, the reduced count will be stored by flip-flop 63 when clocked by filter circuit 62. The stored count then serves as the control signal for main output stage 12, causing main output stage 12 to become weaker.

Conversely, if compare circuit 60 detects that the transition of signal IN_C is completely propagated through scaled output stage 16 after the pulse of reference signal REF has completely propagated to compare circuit 60, then the propagation delay through scaled output stage 16 is too great. This condition indicates that the strength of scaled output stage 16 is too small. Compare circuit 60 then generates signal UP with a logic high level, which causes up/down counter 61 to increment its count. The increased count causes scaled output stage 16 to become stronger as described above in conjunction with FIG. 3. Again, when not in steady state, the increased count will be stored by flip-flop 63 when clocked by filter circuit 62. The stored count then services as the control signal for main output stage 12, causing main output stage 12 to become stronger.

Assuming the PVT effects and the clock frequency are steady, this process will repeat until the count generated by up/down counter 61 transitions back and fourth between two values. That is, at one count, the propagation delay will be just within the reference value, which causes the count to decrement and weaken scaled output stage 16. This in turn causes the propagation delay to be just outside the reference value, which causes the count to increment and strengthen scaled output stage 16. Further, if the system is noisy, then the count may increment and decrement through three values (e.g., 3, 4, 5, 4, 3, 4, 5, . . . ).

Filter circuit 62 is designed so that when a sequence of counts is received in which the counts alternate between two values, filter circuit 62 will choose one of the values. When the sequence varies between three values, then filter circuit 62 is designed to choose the middle value. Filter circuit 62 can be implemented with a relatively simple circuit that advantageously eliminates the need for a separate locking circuit. Such conventional locking circuits tend to be relatively large and complex compared to filter circuit 62. This feature provides a locking function that "filters out" these steady state fluctuations of the up/down counter. This feature provides advantage over the embodiment of FIG. 1 in that these fluctuations are not transmitted to the main output stage. One embodiment of filter circuit 62 is described below in conjunction with FIG. 10.

Figure 7:
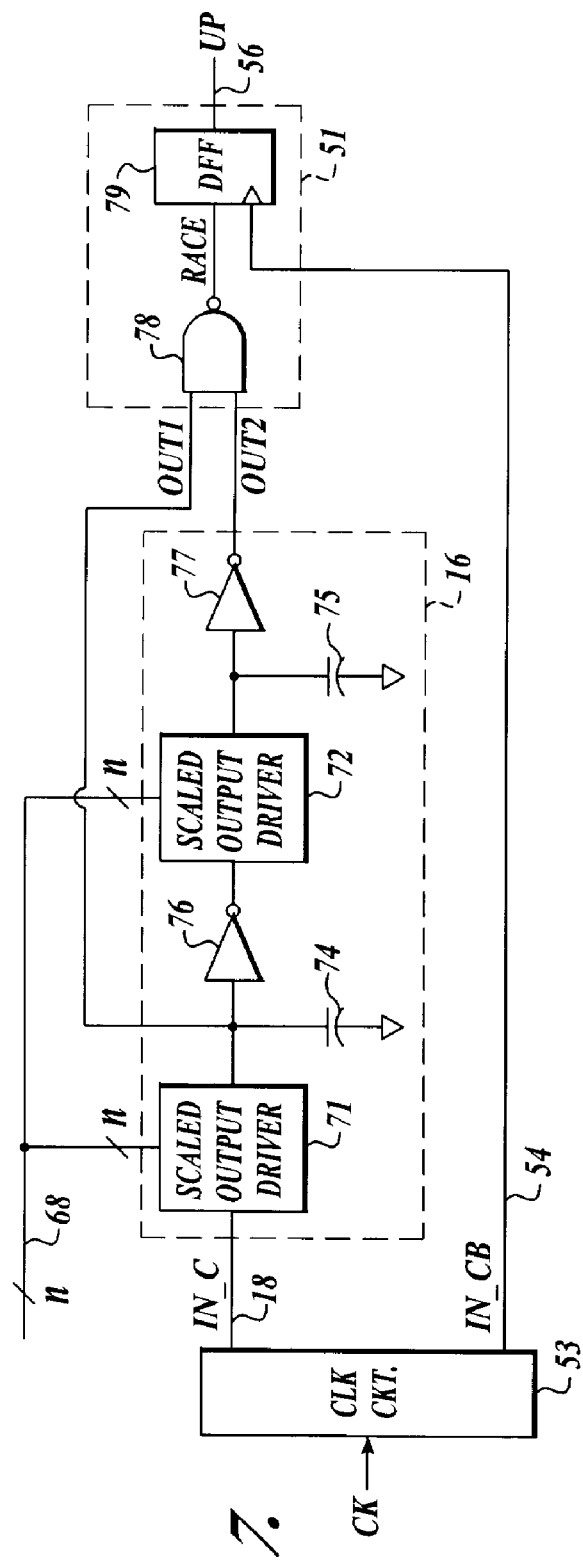
FIG. 7 is a schematic diagram illustrating the delay detector and scaled output stage depicted in FIG. 6, according to one embodiment of the present invention.

FIG. 7 illustrates delay detector 51 and scaled output stage 16 (FIG. 6), according to one embodiment of the present invention. In this embodiment, scaled output stage 16 includes scaled output drivers 71 and 72, capacitors 74 and 75, inverters 76 and 77. In this embodiment, delay detector 51 is implemented with a two-input NAND gate 78 and a D flip-flop 79. Scaled output drivers 71 and 72 are each essentially identical to main output stage 12 (FIG. 2), except for being one-fifth the size. Capacitors 74 and 75 serve as scaled load capacitors to model the maximum capacitive load expected for main output stage 12 (FIG. 2). More specifically, capacitors 74 and 75 are also scaled to have a value that is one fifth of the maximum capacitive load expected for main output stage 12. Clock circuit 53 generates the inverse of internal input signal IN_C (i.e., IN_CB) to serve as the reference signal REF (FIGS. 5 and 6)

This embodiment of delay detector 51 and scaled output stage 16 is interconnected as follows. Scaled output driver 71 has its input terminal connected to line 18 to receive signal IN_C from clock circuit 53. The output terminal of scaled output driver 71 is connected to the input lead of inverter 76, an electrode of capacitor 74, and one input lead of NAND gate 78. The other electrode of capacitor 74 is connected to the ground bus. Scaled output driver 72 has its input terminal connected to the output lead of inverter 76. The output terminal of scaled output driver 72 is connected to the input lead of inverter 77, and an electrode of capacitor 75. The other electrode of capacitor 75 is connected to the ground bus. The output lead of inverter 77 is connected to the other input lead of NAND gate 78. The output lead of NAND gate 78 is connected to the data input terminal of D flip-flop 79. The clock terminal of D flip-flop 79 is connected to receive the reference signal IN_CB. The operation of scaled output stage 16 and delay detector 51 are described below in conjunction with FIG. 8.

Figure 8:
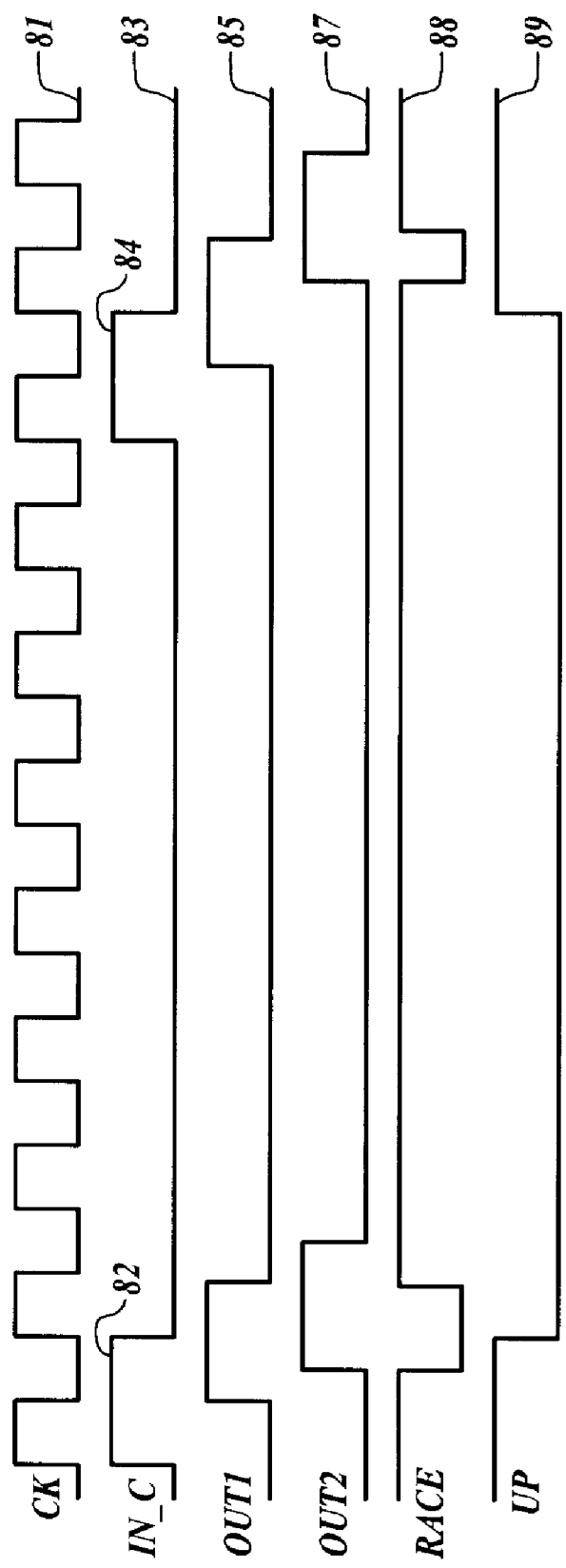
FIG. 8 is a timing diagram illustrating voltage waveforms generated by the control circuit depicted in FIG. 7.

FIG. 8 illustrates voltage waveforms generated by scaled output stage 16 and delay detector 51 (FIG. 7). Referring to FIGS. 7 and 8, these embodiments of scaled output stage 16 and delay detector 51 operate as follows. Clock circuit 53 receives clock signal CK, represented by waveform 81. In response, clock circuit 53 generates internal input signal IN_C with a frequency that is one-eight that of clock signal CK, as represented by waveform 83. This lower frequency helps reduce power dissipation by the control circuit. In this embodiment, signal IN_C has a pulse width equal to one clock period of the clock signal CK. In one embodiment, the output driver is used in a 100 MHz ADC, with the pulse width of signal IN_C being equal to the clock period of the ADC. Scaled output driver 71 receives signal IN_C and outputs a signal OUT1, represented by a waveform 85. Signal OUT1 is a delayed version of signal IN_C. This propagation delay models the rise time of main output driver 12. Signal OUT1 is then propagated through inverter 76 and scaled output driver 72. Capacitor 74 delays the propagation of signal OUT1 to scaled output driver 72, modeling the effect of the maximum expected capacitive load to be driven by main output stage 12 (FIG. 1). Scaled output driver 72 then outputs signal OUT2 (waveform 87), which is a delayed version of signal OUT1. The propagation delay imparted by scaled output driver 72 models the fall time of main output driver 12.

Signals OUT1 and OUT2 are received by NAND gate 78. When signals OUT1 and OUT2 are both at logic high levels, NAND gate 78 outputs a signal RACE with a logic low level. In the first cycle of signal IN_C, the rising edges of signals OUT1 and OUT2 occur during a pulse 82 of signal INC. Because both transitions occur during pulse 82 (within the reference value), signal RACE is at a logic low level when signal IN_C transitions to a logic low level. This causes signal IN_CB to clock flip-flop 79, thereby causing signal UP to transition to a logic low level. As previously described, this causes up/down counter to decrease its count, thereby weakening scaled output stage 16.

In contrast, in this example of the second cycle of signal IN_C, the rising edge of signal OUT1 occurs during a pulse 84 of signal IN_C, but the rising edge of signal OUT2 occurs after pulse 84. Therefore, signal RACE does not transition to a logic low level until after the falling edge of pulse 84. Thus, signal RACE is at a logic high level when signal IN_CB causes flip-flop 79 to store the logic level of signal RACE. Consequently, signal UP transitions to a logic high level, which in turn causes up/down counter to increment its count and strengthen scaled output stage 16.

Figure 9:
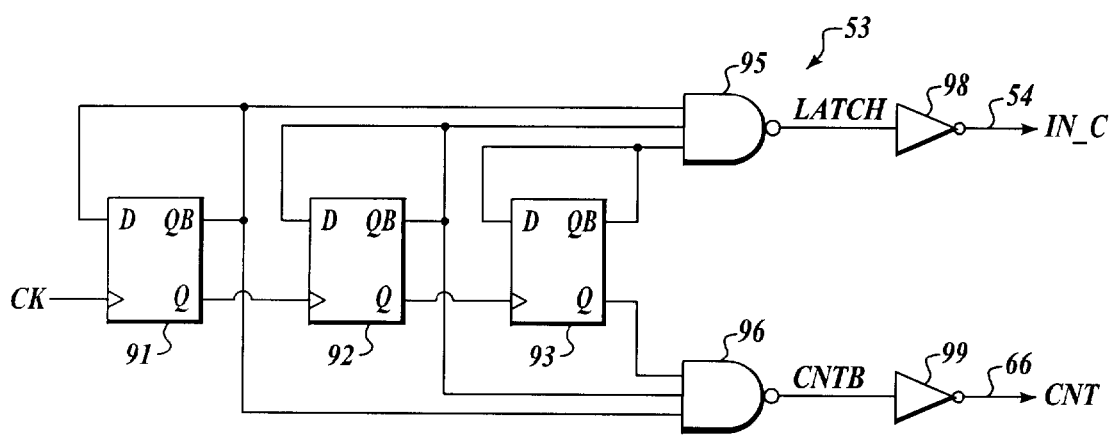
FIG. 9 is a schematic diagram illustrating an implementation of the clock circuit, according to one embodiment of the present invention.

FIG. 9 illustrates an implementation of clock circuit 53 (FIG. 8), according to one embodiment of the present invention. In this embodiment, clock circuit 53 includes D flip-flops 91–93, three-input NAND gates 95 and 96, and inverters 98 and 99. Flip-flop 91 has its clock terminal connected to receive clock signal CK. The inverting output terminals of flip-flops 91–93 are each connected to its own data input terminal. Further, the non-inverting output terminals of flip-flops 91 and 92 are connected to the clock terminals of flip-flops 92 and 93, respectively. In addition, the inverting output terminals of flip-flops 91 and 92 are connected to two of the input leads of NAND gates 95 and 96. Flip-flop 93 has its inverting output terminal connected to the remaining input lead of NAND gate 95, and its non-inverting output terminal connected to the third input lead of NAND gate 96. The output leads of NAND gates 95 and 96 are connected to the input leads of inverters 98 and 99, respectively.

Flip-flops 91–93 as connected to NAND gate 95 operate as a divide-by-eight counter. Inverter 98, receiving the output signal of NAND gate 95 generates signal IN_C as illustrated in FIG. 8. Flip-flops 91–93 as connected to NAND gate 96 generate signal CNT, which is similar to signal IN_C except shifted by one half of the period of signal IN_C. This ensures that signal CNT does not transition during a pulse of signal IN_C.

Figure 10:
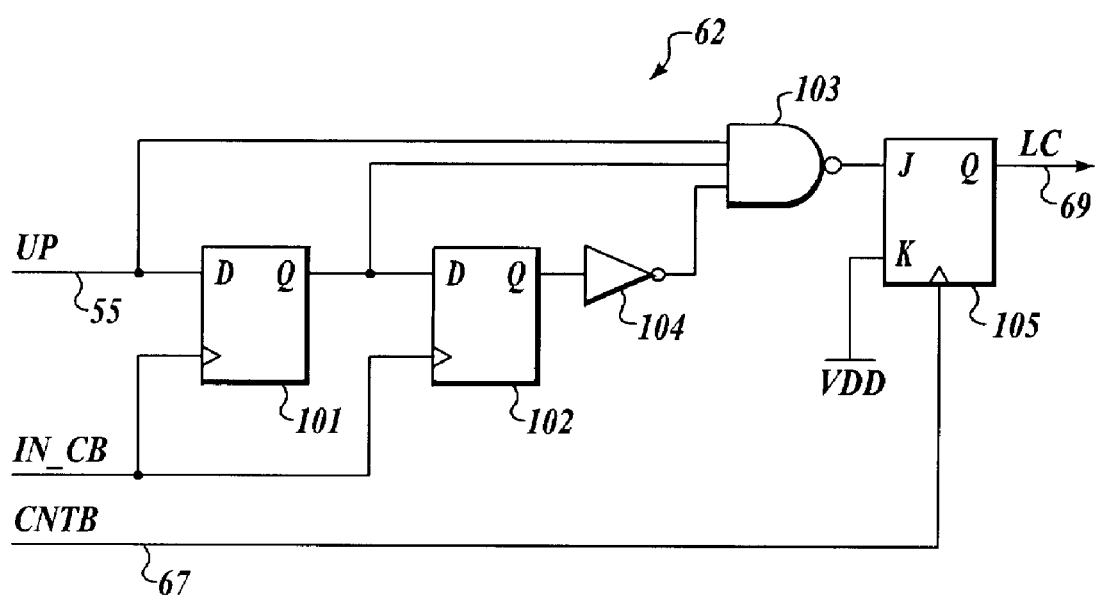
FIG. 10 is a schematic diagram illustrating a filter circuit for use in a DLL circuit, according to one embodiment of the present invention.

FIG. 10 illustrates filter circuit 62 (FIG. 6), according to one embodiment of the present invention. In this embodiment, filter circuit 62 includes D flip-flops 101 and 102, three input NAND gate 103, inverter 104, and JK flip-flop 105. D flip-flop 101 is connected to receive signal UP at its data input terminal. The data input terminal of flip-flop 102 is connected to the non-inverting output terminal of flip-flop 101. Inverter 104 is connected to the non-inverting output terminal of flip-flop 102. Flip-flops 101 and 102 are clocked by signal IN_CB. NAND gate 103 is connected to receive signal UP, the output signal of flip-flop 101 and the output signal of inverter 104. The J terminal of JK flip-flop 105 is connected to the output lead of NAND gate 103 and is clocked by signal CNTB (the inverse of signal CNT of FIG. 9). The K terminal is connected to the VDD bus. Therefore, when clocked, JK flip-flop 105 resets when a signal UP is at a logic low level and toggles its output signal when signal UP is at a logic high level.

Flip-flops 101 and 102 form a delay chain so that alternating logic values of signal UP cause NAND gate 103 to output a logic high level, which causes the output of JK flip-flop 105 to toggle. However, only every other transition of signal UP will cause signal LC to generate a clocking edge. Consequently, the same count will be clocked into D flip-flop 63 (FIG. 6). When the count varies between three values (e.g., signal UP 0, 1, 1), this circuit latches the middle value because the sequence of values 0, 1, 1 in signal UP will cause JK flip-flop 105 to reset. In this way, filter circuit 62 prevents strength variation of the scaled output stage from being passed to the main output stage, thereby eliminating the need for a separate locking function.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An output driver circuit comprising:

an adjustable output stage that is coupled to receive an input signal and a control signal, wherein the adjustable output stage has an associated driver strength that varies in response to the control signal; and a control circuit that is coupled to the adjustable output stage, the control circuit comprising a delay locked loop (DLL) circuit and a scaled adjustable output stage, wherein the control circuit generates the control signal as a function of a propagation delay of the scaled adjustable output stage that is detected by the DLL circuit, the DLL circuit comprising a clock circuit, a delay detector, and an output stage controller, wherein the clock circuit is coupled to receive a clock signal and generate an internal input signal and a reference signal in response to the clock signal, the internal input signal is propagated through the scaled adjustable output stage to provide the propagation delay, the delay detector is coupled to the clock circuit and configured to compare the propagation delay to the reference signal and generate a comparison signal in response thereto, and the output stage controller is coupled to the delay detector and the scaled adjustable output stage and is configured to generate the control signal as a function of the comparison signal, and the output stage controller comprising an up/down counter, a filter circuit, and a flip-flop circuit, wherein the up/down counter is coupled to receive the comparison signal, and configured to generate a count that is dependent on the comparison signal, the filter circuit is coupled to receive the comparison signal and generate a strobe signal, and the flip-flop circuit is coupled to the up/down counter and the filter circuit such that the flip-flop circuit is configured to store the count generated by the up/down counter when enabled by the strobe signal.

2. The circuit of claim 1, wherein the filter circuit comprises:

a first D flip-flop;

a second D flip-flop coupled to the first flip-flop;

a logic gate having input terminals coupled to receive the comparison signal, and coupled to output terminals of the first and second D flip-flops; and a JK flip-flop coupled to the logic gate.

3. An output driver circuit comprising:

an adjustable output stage that is coupled to receive an input signal and a control signal, wherein the adjustable output stage has an associated driver strength that varies in response to the control signal; and a control circuit that is coupled to the adjustable output stage, the control circuit comprising a delay locked loop (DLL) circuit and a scaled adjustable output stage, wherein the control circuit generates the control signal as a function of a propagation delay of the scaled adjustable output stage that is detected by the DLL circuit, the DLL circuit comprising a clock circuit, a delay detector, and an output stage controller, wherein the clock circuit is coupled to receive a clock signal and generate an internal input signal and a reference signal in response to the clock signal, the internal input signal is propagated through the scaled adjustable output stage to provide the propagation delay, the delay detector is coupled to the clock circuit and configured to compare the propagation delay to the reference signal and generate a comparison signal in response thereto, and the output stage controller is coupled to the delay detector and the scaled adjustable output stage and is configured to generate the control signal as a function of the comparison signal, the scaled adjustable output stage comprising a first scaled output driver block and a second scaled output driver block, wherein the delay detector includes a NAND gate having a first input lead coupled to an output lead of the first scaled output driver block and having a second input lead coupled to an output lead of the second scaled output driver block.

4. An output driver circuit comprising:

an adjustable output stage that is coupled to receive an input signal and a control signal, wherein the adjustable output stage has an associated driver strength that varies in response to the control signal; and a control circuit that is coupled to the adjustable output stage, the control circuit comprising a delay locked loop (DLL) circuit and a scaled adjustable output stage, wherein the control circuit generates the control signal as a function of a propagation delay of the scaled adjustable output stage that is detected by the DLL circuit, the DLL circuit comprising a clock circuit, a delay detector, and an output stage controller, wherein the clock circuit is coupled to receive a clock signal and generate an internal input signal and a reference signal in response to the clock signal, the internal input signal is propagated through the scaled adjustable output stage to provide the propagation delay, the delay detector is coupled to the clock circuit and configured to compare the propagation delay to the reference signal and generate a comparison signal in response thereto, and the output stage controller is coupled to the delay detector and the scaled adjustable output stage and is configured to generate the control signal as a function of the comparison signal, wherein the clock circuit comprises:

a first flip-flop;
a second flip-flop coupled to the first flip-flop;
a third flip-flop coupled to the second flip-flop;
a first NAND gate coupled to inverting output terminals of the first, second and third flip-flops; and
a second NAND gate coupled to inverting output terminals of the first and second flip-flops and to a non-inverting output terminal of the third flip-flop.

5. An output driver circuit comprising:

an adjustable output stage that is coupled to receive an input signal and a control signal, wherein the adjustable output stage includes a tri-state circuit, a first pre-drive circuit, a second pre-drive circuit and at least one output cell, wherein the tri-state circuit is coupled to receive the input signal, the first and second pre-drive circuits are coupled to receive output signals from the tri-state circuit, and the output cell is coupled to receive output signals from the first and second pre-drive circuits, wherein the adjustable output stage has an associated driver strength that varies in response to the control signal; and a control circuit that is coupled to the adjustable output stage, the control circuit comprising a delay locked loop (DLL) circuit and a scaled adjustable output stage, wherein the control circuit generates the control signal as a function of a propagation delay of the scaled adjustable output stage that is detected by the DLL circuit, the DLL circuit comprising a clock circuit, a delay detector, and an output stage controller, wherein the clock circuit is coupled to receive a clock signal and generate an internal input signal and a reference signal in response to the clock signal, the internal input signal is propagated through the scaled adjustable output stage to provide the propagation delay, the delay detector is coupled to the clock circuit and configured to compare the propagation delay to the reference signal and generate a comparison signal in response thereto, and the output stage controller is coupled to the delay detector and the scaled adjustable output stage and is configured to generate the control signal as a function of the comparison signal.

6. An output driver circuit, comprising:

an output stage coupled to receive an input signal and a control signal, wherein the output stage includes means for varying its strength in response to the control signal; and control means, coupled to the output stage, for providing the control signal, the control means including a delay locked loop (DLL) circuit and a scaled adjustable output stage, wherein the control means is configured to generate the control signal as a function of a propagation delay of the scaled adjustable output stage that is detected by the DLL circuit.

7. The circuit of claim 6 wherein the DLL circuit comprises;

clock means, coupled to receive a clock signal, for generating an internal input signal and a reference signal in response thereto, the internal input signal being propagated through the scaled adjustable output stage to provide the propagation delay;

detector means, coupled to the clock means, for comparing the propagation delay to the reference signal and generating a comparison signal in response thereto; and controller means, coupled to the detector means and the scaled adjustable output stage, for generating the control signal as a function of the comparison signal.

8. The circuit of claim 7, wherein the controller means includes:

an up/down counter coupled to receive the comparison signal, wherein the up/down counter is configured to generate a count that is dependent on the comparison signal;

means, coupled to receive the comparison signal, for generating a strobe signal; and means, coupled to the up/down counter and a filter circuit, for storing the count generated by the up/down counter when enabled by the strobe signal.

9. The circuit of claim 7 wherein the scaled adjustable output stage includes a first scaled output driver block and a second scaled output driver block.

10. The circuit of claim 9 wherein thee detector means includes a NAND gate having a first input lead coupled to an output lead of the first scaled output driver block and having a second input lead coupled to an output lead of the second scaled output driver block.

11. The output driver circuit of claim 6, the scaled adjustable output stage further comprising:

a plurality of pull-up and pull-down devices wherein the pull-up devices are coupled in parallel with each other, and the pull-down devices are coupled in parallel with each other.

12. An output driver circuit, comprising:

an adjustable output stage that is coupled to receive an input signal and a control signal, wherein the adjustable output stage has an associated driver strength that varies in response to the control signal; and a control circuit that is coupled to the adjustable output stage, the control circuit comprising a delay locked loop (DLL) circuit and a scaled adjustable output stage, wherein the control circuit generates the control signal as a function of a propagation delay of the scaled adjustable output stage that is detected by the DLL circuit, the DLL circuit comprising a clock circuit, a delay detector, and an output stage controller, wherein the clock circuit is coupled to receive a clock signal and generate an internal input signal and a reference signal in response to the clock signal, the internal input signal is propagated through the scaled adjustable output stage to provide the propagation delay, the delay detector is coupled to the clock circuit and configured to compare the propagation delay to the reference signal and generate a comparison signal in response thereto, and the output stage controller is coupled to the delay detector and the scaled adjustable output stage, and is configured to generate the control signal as a function of the comparison signal, the clock circuit comprising three flip-flops, two NAND gates, and two inverters, wherein each of the three flip-flops has an inverting output terminal, a data input terminal, a clock terminal, and a non-inverting output terminal; the clock terminal of the first of the three flip-flops is connected to receive the clock signal; the first of the three flip-flops is coupled to a second of the three flip-flops; the second of the three flip-flops is coupled to a third of the three flip-flops; a first of the two NAND gates is coupled to the inverting output terminal of each of the three flip-flops, a second of the two NAND gates is coupled to the inverting output terminals of the first of the three flip-flops, the inverting output terminal of the second of the three flip-flops, and the non-inverting output of the third of the three flip-flops; the first of the two NAND gates is coupled to a first of the two inverters; and the second of the two NAND gates is coupled to a second of the two inverters.

* * * * *